(12) United States Patent
Takatori

(10) Patent No.: US 11,594,161 B2
(45) Date of Patent: Feb. 28, 2023

(54) SENSOR AND DISPLAY DEVICE

(71) Applicant: Huawei Technologies Co., Ltd., Shenzhen (CN)

(72) Inventor: Kenichi Takatori, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/241,607

(22) Filed: Apr. 27, 2021

(65) Prior Publication Data

US 2021/0264829 A1  Aug. 26, 2021

Related U.S. Application Data

(63) Continuation of application No. PCT/CN2018/112254, filed on Oct. 27, 2018.

(51) Int. Cl.
   G09G 3/00        (2006.01)
   G09G 3/3233      (2016.01)
   H04N 5/359       (2011.01)

(52) U.S. Cl.
   CPC .......... *G09G 3/006* (2013.01); *G09G 3/3233* (2013.01); *H04N 5/359* (2013.01); *G09G 2300/0426* (2013.01); *G09G 2360/148* (2013.01)

(58) Field of Classification Search
   CPC ................. G09G 3/006; G09G 3/3233; G09G 2300/0426; G09G 2360/148; H04N 5/359; H04N 5/363; H04N 5/3745; H01L 27/14614; H01L 27/14616; H01L 27/3269
   See application file for complete search history.

(56) References Cited

U.S. PATENT DOCUMENTS

| 5,016,108 | A  | 5/1991  | Akimoto et al.    |
| 9,853,084 | B2 | 12/2017 | Caris et al.      |
| 2008/0203930 | A1 | 8/2008 | Budzelaar et al. |
| 2009/0243498 | A1 | 10/2009 | Childs et al.   |
| 2011/0205416 | A1 | 8/2011 | Nishihara        |

(Continued)

FOREIGN PATENT DOCUMENTS

| CN | 101707028 A | 5/2010  |
| CN | 102224730 A | 10/2011 |

(Continued)

OTHER PUBLICATIONS

Jae Kyeong Jeong, Photo-Bias Instability of Metal Oxide Thin Film Transistors for Advanced Active Matrix Display, J. Mater. Res., vol. 28, No. 16, Aug. 28, 2013, 14 pages.

(Continued)

*Primary Examiner* — Adam R. Giesy
(74) *Attorney, Agent, or Firm* — Conley Rose, P.C.

(57) ABSTRACT

A sensor includes a plurality of electric lines including row lines and column lines, a photodiode in a pixel, a drain of a first transistor connected to the photodiode in the pixel, a drain of a second transistor connected in series with a source of the first transistor in the pixel, a source of the second transistor being connected to a column line among the plurality of electric lines, and both a gate of the first transistor and a gate of the second transistor being connected to a row line among the plurality of electric lines, wherein a channel material of the first transistor is different from a channel material of the second transistor.

20 Claims, 21 Drawing Sheets

(56) References Cited

U.S. PATENT DOCUMENTS

| | | |
|---|---|---|
| 2011/0215323 A1 | 9/2011 | Kurokawa et al. |
| 2013/0092927 A1 | 4/2013 | Murai et al. |
| 2013/0313621 A1 | 11/2013 | Yamada et al. |
| 2015/0053935 A1 | 2/2015 | Gupta et al. |
| 2015/0055047 A1 | 2/2015 | Chang et al. |
| 2016/0163259 A1* | 6/2016 | Kanda .................. G09G 3/3233 345/77 |
| 2017/0186782 A1* | 6/2017 | Lee ..................... H01L 27/1225 |
| 2018/0113564 A1* | 4/2018 | Takahashi ........... G06F 3/04166 |
| 2018/0150671 A1* | 5/2018 | Choo ................... G09G 3/3233 |
| 2018/0246214 A1 | 8/2018 | Ishii et al. |
| 2019/0057648 A1 | 2/2019 | Xu |
| 2020/0302873 A1 | 9/2020 | Yamazaki |

FOREIGN PATENT DOCUMENTS

| | | |
|---|---|---|
| CN | 102664187 A | 9/2012 |
| CN | 103681717 A | 3/2014 |
| CN | 203481233 U | 3/2014 |
| CN | 204348302 U | 5/2015 |
| CN | 106875893 A | 6/2017 |
| CN | 106898636 A | 6/2017 |
| CN | 108291961 A | 7/2018 |
| CN | 108615032 A | 10/2018 |
| EP | 2985679 A1 | 2/2016 |
| WO | 2017183355 A1 | 10/2017 |
| WO | 2018133404 A1 | 7/2018 |
| WO | 2018136464 A1 | 7/2018 |

OTHER PUBLICATIONS

Xiaoming Huang et al, Electrical instability of amorphous indium-gallium-zinc oxide thin film transistors under monochromatic light illumination, Appl. Phys. Lett. 100, 243505 (2012), 6 pages.

Sejin Hong et al, Reduction of Negative Bias and Light Instability of a-IGZO TFTs by Dual-Gate Driving, IEEE Electron Device Letters, vol. 35, No. 1, Jan. 2014 93, 3 pages.

Kuo-Jui Chang et al, a-IGZO TFTs Reliability Improvement by Dual Gate Structure, SID 2015 Digest, 4 pages.

* cited by examiner

SENSOR AND DISPLAY DEVICE

CROSS-REFERENCE TO RELATED APPLICATIONS

This application is a continuation of International Patent Application No. PCT/CN2018/112254 filed on Oct. 27, 2018, the disclosure of which is hereby incorporated by reference in its entirety.

TECHNICAL FIELD

The present disclosure relates to a sensor and display device.

BACKGROUND

Some touch sensors comprise a pixel array that includes an oxide thin-film transistor (TFT).

However, after stress is applied to the Oxide TFT, a threshold voltage shifts negatively and leakage current is increased, but the conventional sensor cannot suppress the voltage shift and the leakage current increase.

SUMMARY

According to a first aspect of the present disclosure, a sensor includes a plurality of electric lines including row lines and column lines, a photodiode in a pixel, a drain of a first transistor connected to the photodiode in the pixel, a drain of a second transistor connected in series with a source of the first transistor in the pixel, a source of the second transistor being connected to a column line among the plurality of electric lines, and both a gate of the first transistor and a gate of the second transistor being connected to a row line among the plurality of electric lines, wherein a channel material of the first transistor is different from a channel material of the second transistor. In this way, the sensor can effectively prevent high leakage current of the photodiode after stress.

According to a second aspect of the present disclosure, a sensor includes, a plurality of electric lines including row lines, column lines and reset lines, a photodiode in a pixel, a readout transistor portion arranged between the photodiode and a column line among the plurality of electric lines, a gate of the readout transistor portion being connected to a row line among the plurality of electric lines, a drain of a first transistor connected to the photodiode, a drain of a second transistor connected in series with a source of the first transistor in the pixel, and both a gate of the first transistor and a gate of the second transistor are connected to the reset line, wherein a channel material of the first transistor is different from a channel material of the second transistor. In this way, the sensor can effectively prevent high leakage current of the photodiode after stress.

According to the first or second aspect, in the first implement, the channel material of the first transistor may be an oxide and the channel material of the second transistor may be a non-oxide. In this way, because of the uniformity among the Oxide TFT structures, the sensor may have more uniformity among the pixels.

According to the first implement of the first aspect or the first implement of the second aspect, in the second implement, the first transistor may be an oxide TFT and the second transistor may be a poly-silicon (Si) TFT. In this way, because of the uniformity among the Oxide TFT structures, the sensor may have more uniformity among the pixels, and the sensor can effectively prevent high leakage current of the photodiode after stress.

According to the second implement of the first aspect or the second implement of the second aspect, in the third implement, the Oxide TFT may be arranged between a cathode of the photodiode and the poly-Si TFT. In this way, the sensor can effectively prevent high leakage current of the photodiode after stress.

According to the second or third implement of the first aspect or the second or third implement of the second aspect, in the fourth implement, the poly-Si TFT may include a twin-gated structure having a split gate. In this way, the twin-gated TFT can effectively reduce leakage current more than the single-gated TFT.

According to any one of the second to the fourth implements of the first aspect or any one of the second to the fourth implements of the second aspect, in the fifth implement, the Oxide TFT may include a tied dual-gated structure having top- and bottom-gates that are connected to the same electric line among the plurality of electric lines. In this way, the tied dual-gated structure can effectively reduce gate voltage and power consumption compared to a top gate only structure. In addition, the tied dual-gated structure can effectively achieve stability.

According to any one of the second to the fourth implements of the first aspect or any one of the second to the fourth implements of the second aspect, in the sixth implement, the Oxide TFT may include a dual-gated structure having a top gate connected to a first line among the plurality of electric lines and a bottom gate connected to a second line among the plurality of electric lines that may be different from the first line. In this way, the tied dual-gated structure can effectively reduce gate voltage and power consumption compared to a top gate only structure.

According to the first aspect, the second aspect, any implement of the first aspect, or any implement of the second aspect, in the seventh implement, the gate of the first transistor and the gate of the second transistor may be connected to the same electric line among the plurality of electric lines. In this way, the sensor can effectively reduce the number of electric lines connecting the Oxide TFT 10 and the poly-Si TFT 20.

According to the first aspect, the second aspect, any implement of the first aspect, or any implement of the second aspect, in the eighth implement, the first transistor may be a bottom gate transistor and the second transistor may be a top gate transistor. In this way, the combination of the bottom-gated first transistor and the top-gated second transistor can effectively simplify manufacturing.

According to the first aspect, the second aspect, any implement of the first aspect, or any implement of the second aspect, in the ninth implement, the first and second transistors may be top gate transistors, and the second transistor may be disposed in a layer that is lower than a layer in which the first transistor is disposed. In this way, both the first and second transistors have a top-gated structure, parasitic capacitance can be reduced compared to the bottom-gated transistors.

According to the first aspect, the second aspect, any implement of the first aspect, or any implement of the second aspect, in the tenth implement, the sensor may include a light shield layer located under the first transistor, the light shield layer consisting of the same material as a gate material of the second transistor. In this way, the light shield layer may prevent incident light from entering the first transistor. Since the first transistor is sensitive to light stress, the light shield layer may be effective in achieving high reliability and stability.

According to a third aspect of the present disclosure, a display device may include the sensor of the first or second aspect of the present disclosure, and a light emitting portion, the light emitting portion and the sensor may be provided in the same pixel. In this way, the display device can effectively prevent high leakage current of the photodiode after stress.

According to a fourth aspect of the present disclosure, a display device may include a light emitting portion and a photodiode portion. The light emitting portion includes a light emitting diode, a switching transistor, and a first reset transistor. The photodiode portion includes a readout transistor and a second reset transistor. During a light emitting period of the light emitting diode, the second reset transistor resets data, and during a readout period of the readout transistor, the first reset transistor resets data. A gate of the switching transistor and a gate of the second reset transistor are connected to a first scan line, and the gate of the first reset transistor and the readout transistor are connected to a second scan line. In this way, the display device can effectively reduce the number of electric lines connecting the light emitting portion and the photodiode portion.

According to a fourth aspect of the present disclosure, in the first implement of the fourth aspect, the switching and readout transistors are connected to the same data voltage line, and the first reset transistor and the second reset transistor are connected to the same reference voltage line. In this way, the display device can further reduce the number of electric lines connecting the light emitting portion and the photodiode portion.

The present disclosure may also be a sub-combination of the features described above.

DESCRIPTION OF EMBODIMENTS

Hereinafter, example embodiments of the present disclosure will be described. The example embodiments shall not limit the disclosure according to the claims, and the combinations of the features described in the embodiments are not necessarily essential to the disclosure.

Figure 1:
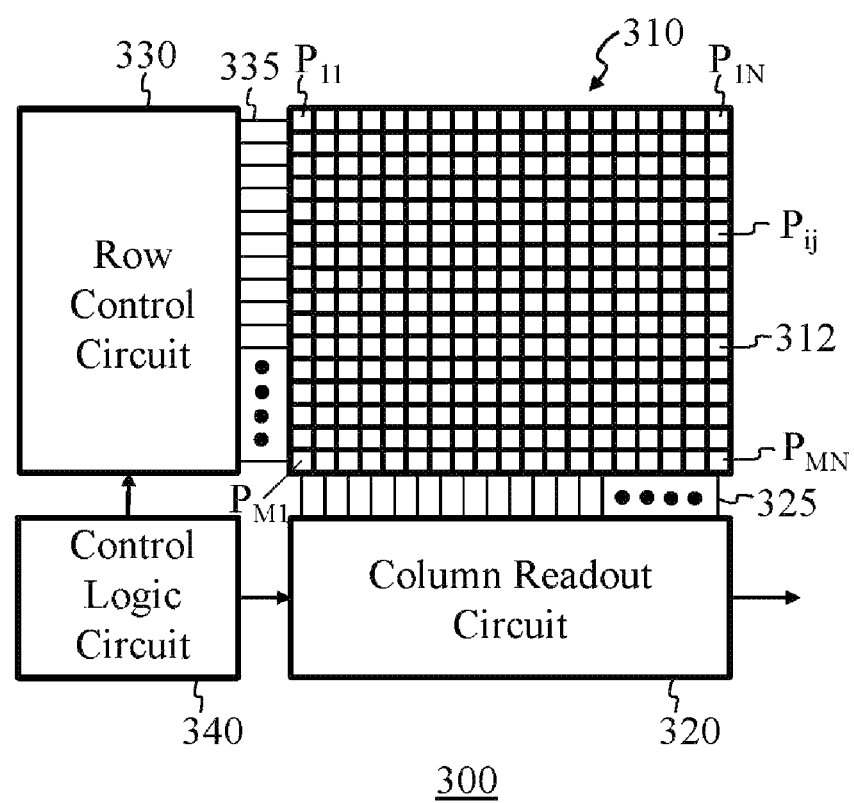
FIG. 1 shows a functional block diagram of a sensor 300.

FIG. 1 shows a functional block diagram of a sensor 300. The sensor 300 includes a pixel array 310, a column readout circuit 320, a row control circuit 330, and a control logic circuit 340. The sensor 300 includes a plurality of electric lines including column lines 325 and row lines 335. The sensor 300 may operate as an image sensor, such as those used widely for light sensing, security sensing, scientific and/or industrial applications, etc.

The pixel array 310 includes a two-dimensional array of elements having a photodiode and TFTs. The pixel array 310 includes a plurality of pixels 312 aligned in two dimensions. The pixel array 310 may include M×N pixels 312 numbered from P11 to PMN, M indicating rows and N indicating columns. Pij represents a pixel 312 located at row i and column j, where i is greater or equal to 1 and less or equal to M, and j is greater or equal to 1 and less or equal to N.

Each pixel 312 may have a PPS architecture or an APS architecture as explained below. The APS architecture includes an amplifier to amplify the electrical signals correspond to the optical signals from the photodiode, but the PPS architecture does not include an amplifier.

The column readout circuit 320 is connected to each pixel 312 through column lines 325. The column readout circuit 320 may read signals from the pixel array 310 to select a specific column of pixels 312. For example, the column readout circuit 320 may read image data from the pixel array 310 through column lines 325.

It will be understood that when an element is referred to as being "connected" to another element, it can be directly connected to the other element or intervening elements may be present. In other words, "connected" expresses that the connection can be direct or indirect.

The row control circuit 330 is connected to each pixel 312 through row lines 335. The row control circuit 330 may transmit reset signals to the pixel array 310 through row lines 335 to select a specific row of pixels 312. For example, the row control circuit 330 may apply the control signal to the pixel array 310 through row lines 335.

The control logic circuit 340 controls the operation of the column readout circuit 320 and the row control circuit 330. The control logic circuit 340 may control timing of the transmission of reset signals or readout signals.

Figure 2A:
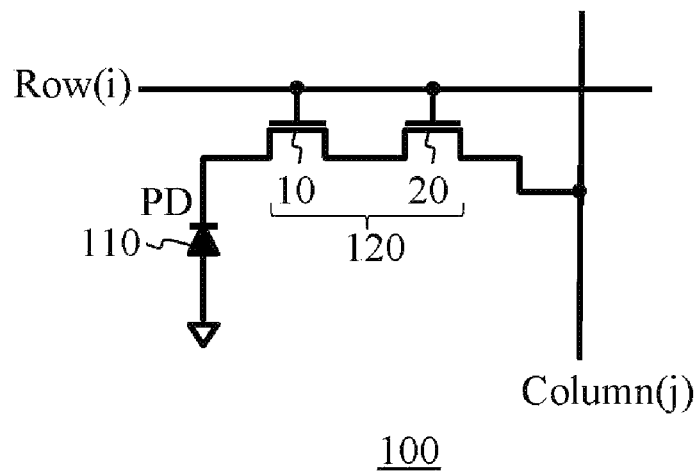
FIG. 2A shows an exemplary configuration of the pixel circuit of passive pixel sensor (PPS) 100.

FIG. 2A shows an exemplary configuration of the pixel circuit of PPS 100 placed in each pixel 312. The PPS 100 includes a photodiode 110 and a readout transistor portion 120.

The photodiode 110 is an optical sensing part of the PPS 100. The photodiode 110 can absorb light and then convert light into electrical signals. The photodiode 110 is capable of detecting optical signals of different wavelengths using semiconductor materials. As an example, the photodiode 110 may have a material such as Si, gallium arsenide (GsAs), indium antimonide (InSb), indium arsenide (InAs), organic semiconductor materials, etc. As an example, the photodiode 110 may have an amorphous Si p-i-n photodiode (a-Si PIN PD). The a-Si PIN PD consists of three layers including a p-doped a-Si layer, an intrinsic a-Si layer and an n-doped a-Si layer stacked between a transparent electrode (anode) and a reflective metal electrode (cathode).

For example, the photodiode 110 may be an amorphous-Si-based PIN photodiode, in which different hydrogenated amorphous Si (a-Si:H) layers, such as p+ a-Si, intrinsic a-Si (i-a-Si), and n+ a-Si, are stacked. In another example, the photodiode 110 may be an organic bulk heterojunction (BHJ) photodiode (PD), which is based on simple planar geometry with the blend of donor and acceptor materials, such as polymer/fullerene composites. This material is sandwiched between electrodes with different work functions for efficient charge extraction in cooperation with an interlayer.

The readout transistor portion 120 switches on to readout the signal from the photodiode 110. The readout transistor portion 120 is arranged between the photodiode 110 and a column line j among the plurality of electric lines. A gate of the readout transistor portion 120 is connected to a row line i among the plurality of electric lines. During a readout period, the readout transistor portion 120 is turned on and outputs electrical signals, which correspond to optical signals detected by the photodiode 110, through the column line j. The readout transistor portion 120 of the PPS 100 includes an Oxide TFT 10 and a poly-Si TFT 20.

The Oxide TFT 10 is connected to the photodiode 110. A drain of the Oxide TFT 10 may be connected to the photodiode 110. As an example, a channel of the Oxide TFT 10 is made of an oxide semiconductor having wide band gap, such as indium-gallium-zinc-oxide (IGZO) or Zinc Oxide (ZnO) TFT. The Oxide TFT 10 shows higher mobility, lower photo sensitivity to visible lights and lower leakage current than Si-based TFT, such as a-Si TFT, microcrystalline Si (μ-c-Si) TFT, and polycrystalline Si (poly-Si) TFT. This low leakage current property is suitable for high signal-to-noise ratio (SNR) image sensor applications. The Oxide TFT 10 is an example of a first transistor.

The poly-Si TFT 20 is connected in series with the Oxide TFT 10 in the same pixel 312. A drain of the poly-Si TFT 20 may be connected in series with a source of the Oxide TFT 10 in the same pixel 312. A source of the poly-Si TFT 20 may be connected to a column line j among the plurality of electric lines. The poly-Si TFT 20 is an example of a second transistor. A channel material of the poly-Si TFT 20 is different from a channel material of the Oxide TFT 10. For example, the channel material of the Oxide TFT 10 is an oxide and the channel material of the poly-Si TFT 20 is a non-oxide. For example, the poly-Si TFT 20 consists of a low-temperature polycrystalline Si (LTPS) thin film transistor.

Both a gate of the Oxide TFT 10 and a gate of the poly-Si TFT 20 are connected to a row line i among the plurality of electric lines. A gate of the Oxide TFT 10 and a gate of the poly-Si TFT 20 are connected to the same electric line. The gates of the Oxide TFT 10 and the poly-Si TFT 20 are connected to row line i and switched at the same time. Therefore, the sensor 300 can reduce the number of electric lines connecting the Oxide TFT 10 and the poly-Si TFT 20.

The Oxide TFT 10 is arranged between a cathode of the photodiode 110 and the poly-Si TFT 20. The order of the Oxide TFT 10 and the poly-Si TFT 20 can be changed. In FIG. 2A, one side of the Oxide TFT 10 is directly connected to the cathode of the photodiode 110, and the other side of the Oxide TFT 10 is directly connected to the poly-Si TFT 20. Conversely, one side of the poly-Si TFT 20 may be directly connected to the cathode of the photodiode 110, and the other side of the poly-Si TFT 20 may be directly connected to the Oxide TFT 10.

The Oxide TFT 10 may have a low leakage current and high pixel-to-pixel uniformity. Therefore, the Oxide TFT 10 may be used where low leakage current is desired or where high pixel-to-pixel uniformity is desired. The poly-Si TFT 20 may be used where attributes such as increased switching speed and good drive current are desired.

Referring to FIG. 2A, the Oxide TFT 10 and the poly-Si TFT 20 are aligned in series, so the leakage current at a certain gate voltage is determined not only by the Oxide TFT 10 but also the poly-Si TFT 20. As described below, a leakage current of the Oxide TFT is increased after stress is applied. Even if the leakage current is increased at the Oxide TFT 10, the poly-Si TFT 20 can suppress the leakage current. Therefore, the combination of the Oxide TFT 10 and the poly-Si TFT 20 may prevent high leakage current of the photodiode 110 after stress, and SNR is improved.

Figure 2B:
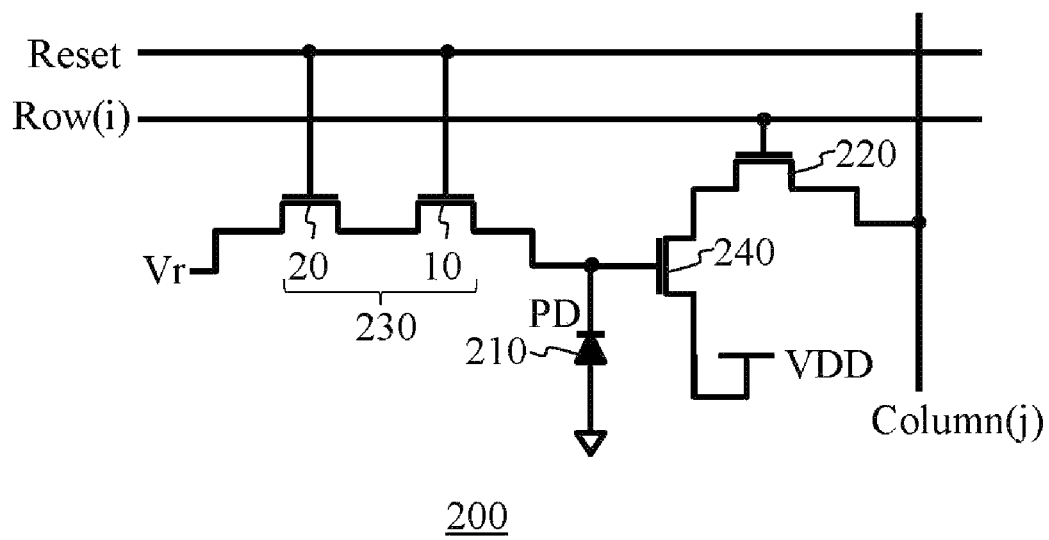
FIG. 2B shows an exemplary configuration of the pixel circuit of active pixel sensor (APS) 200.

FIG. 2B shows an exemplary configuration of the pixel circuit of APS 200 placed in each pixel 312. The APS 200 includes a photodiode 210, a readout transistor portion 220, a reset transistor portion 230, and an amplifier 240. For simplicity in describing FIG. 2B, only structure that is different from FIG. 2A is explained.

The readout transistor portion 220 is arranged between the photodiode 210 and column line j. The readout transistor portion 220 is connected the photodiode 210 through the amplifier 240. A gate of the readout transistor portion 220 is connected to row line i among the plurality of electric lines. During a readout period, the readout transistor portion 220 is turned on and outputs electrical signals, which correspond to optical signals detected by the photodiode 210, through the column line J.

The reset transistor portion 230 is connected to the photodiode 210. A gate of the reset transistor portion 230 is connected to a reset line among the plurality of electric lines. The reset transistor portion 230 applies reset voltage Vr to the photodiode 210, when a reset signal RST is received at the gate of the reset transistor portion 230.

The amplifier 240 amplifies electrical signals from the photodiode 210, and outputs the amplified signals through the readout transistor portion 220. The amplifier 240 is arranged between the photodiode 210 and the readout transistor portion 220. A gate of the amplifier 240 is connected to the cathode of the photodiode 210.

The reset transistor portion 230 includes the Oxide TFT 10 and poly-Si TFT 20. A drain of the Oxide TFT 10 may be connected to the photodiode 110. A drain of the poly-Si TFT 20 may be connected in series with a source of the Oxide TFT 10 in the pixel. Both a gate of the Oxide TFT 10 and a gate of the poly-Si TFT 20 are connected to a row line i among the plurality of electric lines. The combination of the Oxide TFT 10 and the poly-Si TFT 20 may reduce the leakage current through the reset transistor portion 230 even though the threshold voltage of the Oxide TFT 10 is negatively shifted.

The APS 200 may keep the leakage current lower even though the threshold voltage of the Oxide TFT 10 shifts negatively, and leakage current of the poly-Si TFT 20 goes up with temperature. As a result, the reduction of leakage current of the reset transistor portion 230 reduces shot noise of APS 200 that naturally occurs from the leakage current.

The APS architecture may obtain higher SNR than PPS architecture by reducing noise. For example, in combination with an external CDS circuit, the APS 200 may eliminate fixed pattern noise (FPN). The FPN is caused by random variations, such as variations in geometrical size of a photodiode and variations in dark current at the readout transistor portion 220 and the amplifier 240. The APS 200 may also eliminate the 1/f noise. Therefore, the APS 200 can be used for low light flux or high-sensitivity applications.

In these embodiments, the readout transistor portion 120 and the reset transistor portion 230 are made using different TFT materials, such as the Oxide TFT and the poly-Si TFT, as shown in FIG. 2A and FIG. 2B. This hybrid TFT technology, which uses different TFT materials, may achieve both the stability and reliability of each TFT material. Next, general characteristics of the Oxide TFT and the poly-Si TFT before and after stress are explained.

Figure 3A:
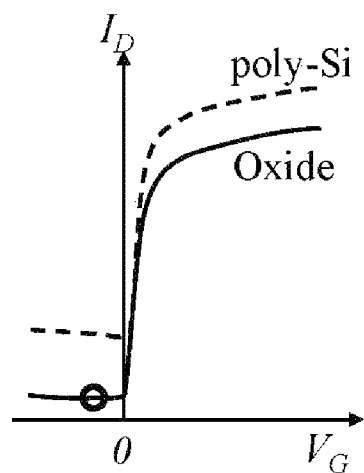
FIG. 3A shows transfer characteristics at an initial state of a poly-Si TFT and an Oxide TFT.

FIG. 3A shows transfer characteristics at an initial state of a poly-Si TFT and an Oxide TFT. At an initial state, stresses such as gate bias stress, light stress and thermal stress have not been applied to the Oxide TFT and the poly-Si TFT. The solid line indicates the transfer characteristics of the Oxide TFT. The dotted line indicates the transfer characteristics of the poly-Si TFT. The vertical axis indicates the drain current ID, and the horizontal axis indicates the gate voltage VG. At an initial state, the leakage current of the Oxide TFT is lower than that of the poly-Si TFT.

Figure 3B:
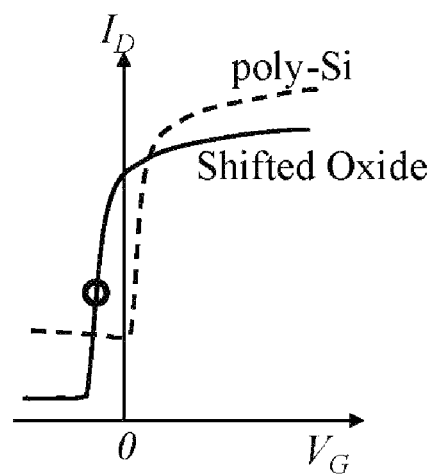
FIG. 3B shows transfer characteristics after stress is applied to the poly-Si TFT and the Oxide TFT.

FIG. 3B shows transfer characteristics after stress is applied to the poly-Si TFT and the Oxide TFT. The solid line indicates the transfer characteristics of the Oxide TFT after stress is applied to the Oxide TFT. The dotted line indicates the transfer characteristics of the poly-Si TFT after stress is applied to the poly-Si TFT. The threshold voltage of the Oxide TFT shows a negative shift, while the threshold voltage of the poly-Si TFT remains stable.

Circles shown in FIG. 3A and FIG. 3B indicate drain current ID at the same negative gate voltage VG. In FIG. 3A, if a negative gate voltage VG marked by the circle is applied, the drain current ID of the Oxide TFT is lower than that of the poly-Si TFT. On the other hand, in FIG. 3B, if the negative gate voltage VG marked by the circle is applied, the drain current ID of the Oxide TFT is higher than that of the poly-Si TFT. This is because the threshold voltage of the Oxide TFT is negatively shifted, while the threshold voltage of the poly-Si TFT remains stable.

As the applied stress increases, the threshold voltage may shift more negatively. For example, a negative shift relates to stress duration. Longer stress durations shift the threshold voltage more negatively. In addition, shorter wavelength light may show larger negative shifts in threshold voltage. As a result of this negative shift caused by the stress, the leakage current of the Oxide TFT may be larger at a certain gate voltage VG, even if the leakage current is lower at an initial state.

Figure 4A:
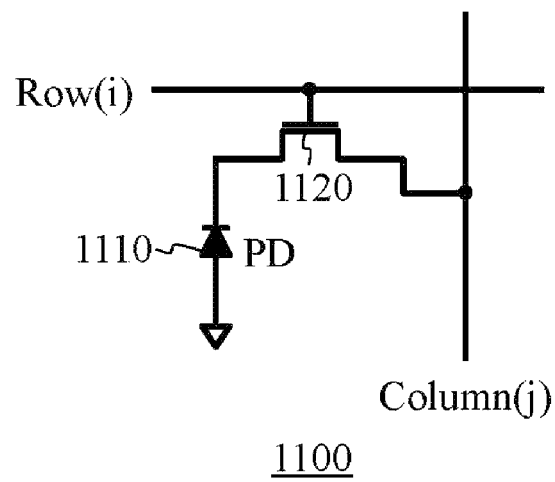
FIG. 4A shows a comparative configuration of PPS 1100 placed in each pixel.

FIG. 4A shows a comparative configuration of PPS 1100 placed in each pixel. The PPS 1100 includes a photodiode 1110 and a readout transistor 1120. In the comparative configuration of FIG. 4A, the readout transistor 1120 consists of only an Oxide TFT. Compared to FIG. 2A, the combination of the Oxide TFT 10 and the poly-Si TFT 20 of the readout transistor portion 120 are changed to the Oxide TFT in FIG. 4A. Therefore, the readout transistor 1120 cannot suppress the leakage current of the Oxide TFT, after stress is applied to the readout transistor 1120.

Figure 4B:
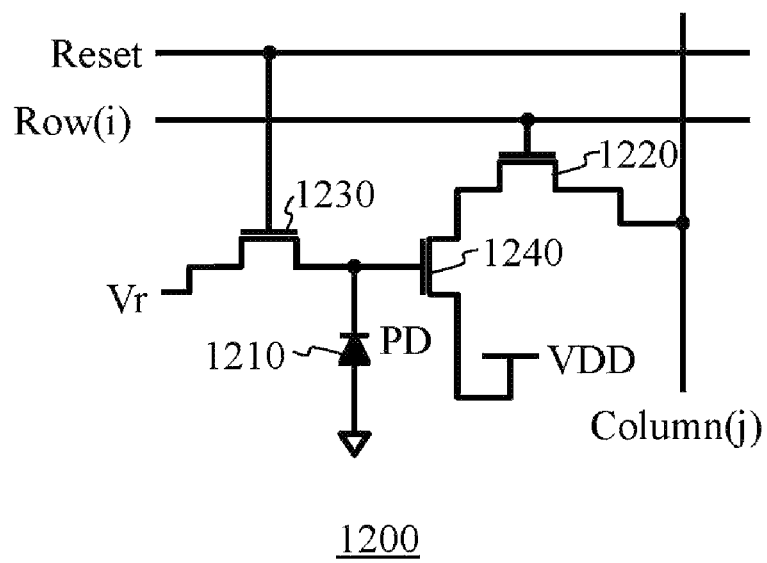
FIG. 4B shows a comparative configuration of APS 1200 placed in each pixel.

FIG. 4B shows a comparative configuration of APS 1200 placed in each pixel. The APS 1200 includes a photodiode 1210, a readout transistor 1220, a reset transistor 1230 and an amplifier 1240. In the comparative configuration of FIG. 4B, the reset transistor 1230 consists of only an Oxide TFT. Compared to FIG. 2B, the combination of the Oxide TFT 10 and the poly-Si TFT 20 of the reset transistor portion 230 are changed to the Oxide TFT in FIG. 4B. Therefore, the readout transistor 1220 cannot suppress the leakage current of the Oxide TFT, after stress is applied to the readout transistor 1220.

The leakage current of a TFT increases a shot noise of the TFT, and also decreases signal level by reducing a light-produced charge or voltage through the leakage effect. Thus, as a result of increased leakage current, SNR is reduced.

On the other hand, in the embodiments disclosed in FIG. 2A and FIG. 2B, the leakage current at an OFF state with a certain gate voltage may be kept low even though the threshold voltage of the Oxide TFT shifts negatively. By maintaining a low leakage current, the noise level of the pixel may be kept low, and the signal level may be kept high. The reliability and stability of the image sensor and its SNR may be improved.

For example, for gate-to-source voltage VGS=-7 volts (V) and drain-to-source voltage VDS=0.1 V, a normalized leakage current of the Oxide TFT Ileak(-7V)_Oxide is 0.01 femtoamps (fA) and that of the poly-Si TFT Ileak(-7V)poly is 100 fA. The normalized leakage current means a leakage current for the ratio of channel width and length is one; W/L=1.

At an initial state, the current at VGS=-7 V and VDS=0.1 V for the readout transistor 1120 is the same as the leakage current Ileak(-7V) Oxide of the readout transistor portion made of the Oxide TFT, which is 0.01 fA. If the threshold voltage of the Oxide TFT negatively shifts after stress is applied, the leakage current of the Oxide TFT at VGS=-7 V and VDS=0.1V Ileak(-7V) oxide goes up to 100 picoamps (pA) (=100,000 fA), the current at VG=-7 V and VDS=0.1 V for the readout transistor 1120 is the same as 100,000 fA. In this case, the leakage current at VG=-7 V and VDS=0.1 V increases 10,000,000 times from the initial state to the state after stress is applied.

On the other hand, referring to FIG. 2A, the current at VGS=-7 V and VDS=0.1V through the combination of the Oxide TFT 10 and the poly-Si TFT 20 is mainly determined by the poly-Si TFT 20, and its value is around 100 fA. This means the current after stress is applied is only 10,000 times that of the initial state, which is smaller than that of FIG. 4A by about 1,000 times. The leakage current of the poly-Si TFT 20 has a larger temperature dependence than the Oxide TFT 10, but the range is around a 3-times increase for a temperature change from room temperature (25) to 50 degrees centigrade. Even taking into consideration the temperature effects, the current at VGS=-7 V and VDS=0.1 V in FIG. 2A is smaller than that of FIG. 4A by about 300 times. Therefore, the sensor 300 having a combination of the Oxide TFT 10 and the poly-Si TFT 20 may realize low leakage current at a certain gate voltage, even if the threshold voltage of the Oxide TFT 10 shows a negative shift.

Figure 5A:
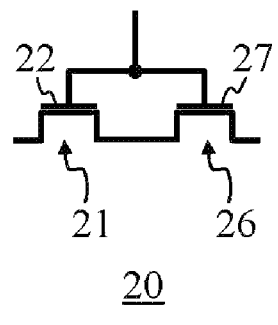
FIG. 5A shows an equivalent circuit of a twin-gated TFT.

FIG. 5A shows an equivalent circuit of a twin-gated TFT. The poly-Si TFT 20 may include a twin-gated structure having a split gate. The poly-Si TFT 20 includes a TFT 21 and a TFT 26 having a gate 22 and a gate 27 connected each other in a split gate configuration. The TFT 21 and the TFT 26 are in series. The poly-Si TFT 20 of a twin-gated structure may be applied to both PPS and APS architectures.

The twin-gated TFT tends to reduce leakage current more than the single-gated TFT. If the twin-gated TFT is used for the poly-Si TFT 20, it may further suppress the leakage current of the photodiode. In a simple estimation, the leakage current of the twin-gated TFT may become half of the leakage current of the single-gated TFT. Therefore, the twin-gated TFT may reduce leakage current and improve the bias stability.

Figure 5B:
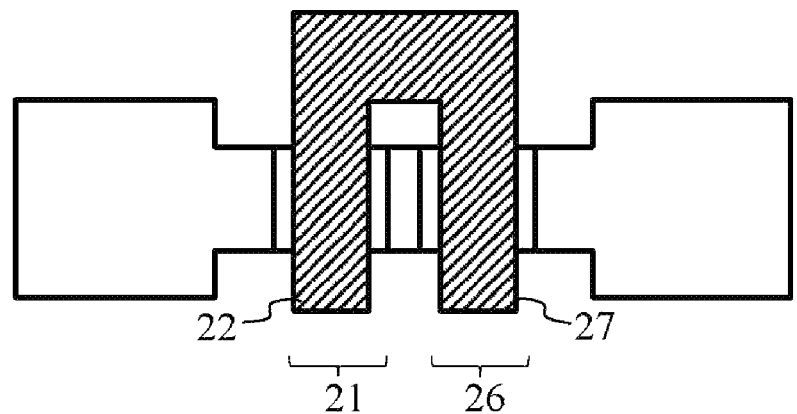
FIG. 5B shows the plan view of the poly-Si TFT 20 of twin-gated TFT structure.

FIG. 5B shows the plan view of the poly-Si TFT 20 having a twin-gated TFT structure. The TFT 21 and the TFT 26 are in series, with the gates of both TFTs connected, and the source/drain of TFT 21 and drain/source of TFT 26 being connected and shared. The poly-Si TFT 20 includes a U-shaped gate electrode having at least two gates 22 and 27.

The gates 22 and 27 are elongated sections which are parallel to each other and separated. One gate 22 acts as the gate of the TFT 21, while the other gate 27 acts as the gate of the TFT 26. As shown in FIG. 5B, the gate of the poly-Si TFT 20 is split into two gates 22 and 27. In other words, one side of the gates of the poly-Si TFT 20 are separated but the other side is connected.

There is no contact area for the shared region of the source/drain of TFT 21 and drain/source of TFT 26. The structure shown in this plan view may keep the area of the poly-Si TFT 20 small. The area value of the twin-gated TFT is less than twice the area of a single-gated TFT.

As described above, the twin-gated TFT structure may be used for the poly-Si TFT 20. If the Oxide TFT 10 and the poly-Si TFT 20 are used in series for leakage current reduction, the LTPS TFT keeps the leakage current lower even after the threshold voltage for the Oxide TFT 10 is shifted. This structure is effective for all TFT blocks, but is especially effective for readout TFT in PPS and reset TFT in APS.

Figure 6A:
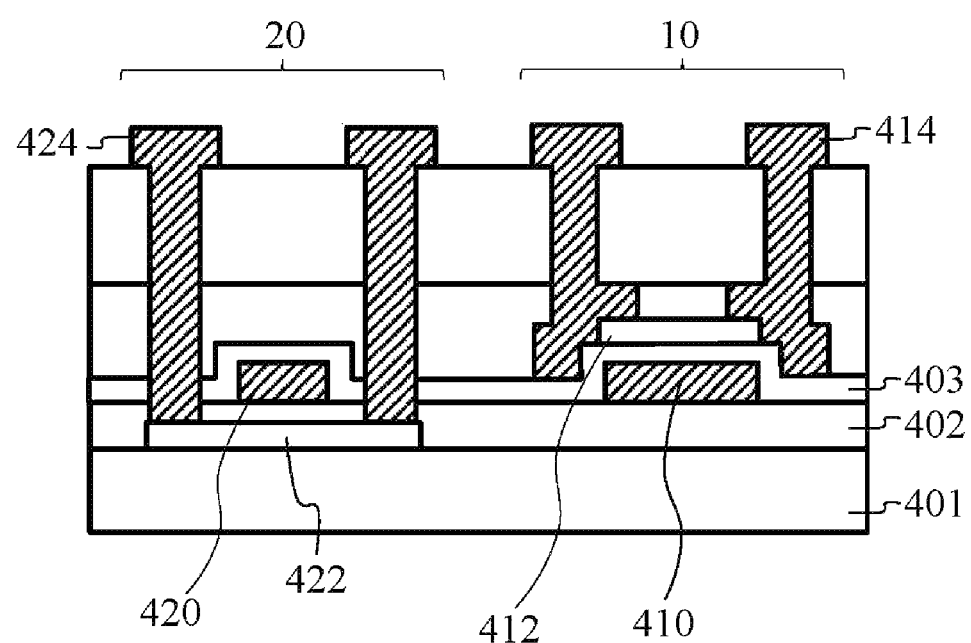
FIG. 6A shows an example cross section of the Oxide TFT 10 and the poly-Si TFT 20.

FIG. 6A shows an example cross section of the Oxide TFT 10 and the poly-Si TFT 20. The Oxide TFT 10 has a bottom-gated structure and the poly-Si TFT 20 has a top-gated structure. The Oxide TFT 10 and the poly-Si TFT 20 are provided above the same substrate 401.

The Oxide TFT 10 includes a gate 410, an oxide semiconductor layer 412 and a gate insulator 403. The oxide semiconductor layer 412 is a channel layer of the Oxide TFT 10 and is connected to vias 414. The gate insulator 403 is formed on the gate insulator 402. The Oxide TFT 10 has a bottom-gated structure, and the gate 410 is located below the oxide semiconductor layer 412 with the gate insulator 403 in between.

The poly-Si TFT 20 includes a gate 420, a poly-Si layer 422 and a gate insulator 402. The poly-Si layer 422 is a channel layer of the poly-Si TFT 20 and connected to vias 424. The gate insulator 402 is formed on the substrate 401. The poly-Si TFT 20 has a top-gated structure, and the gate 420 is located above the poly-Si layer 422 with the gate insulator 402 in between.

The gate 410 of the Oxide TFT 10 and the gate 420 of the poly-Si TFT 20 may be formed by the same conductive material, such as poly-Si or metal. The gates 410 and 420 may be formed in the same process. Since a gate material is shared for the Oxide TFT 10 and the poly-Si TFT 20, the gate insulator 402 and the gate insulator 403 are adjacent each other. Because of the shared layer usage, the combination of the bottom-gated Oxide TFT 10 and the top-gated poly-Si TFT 20 may simplify manufacturing.

Figure 6B:
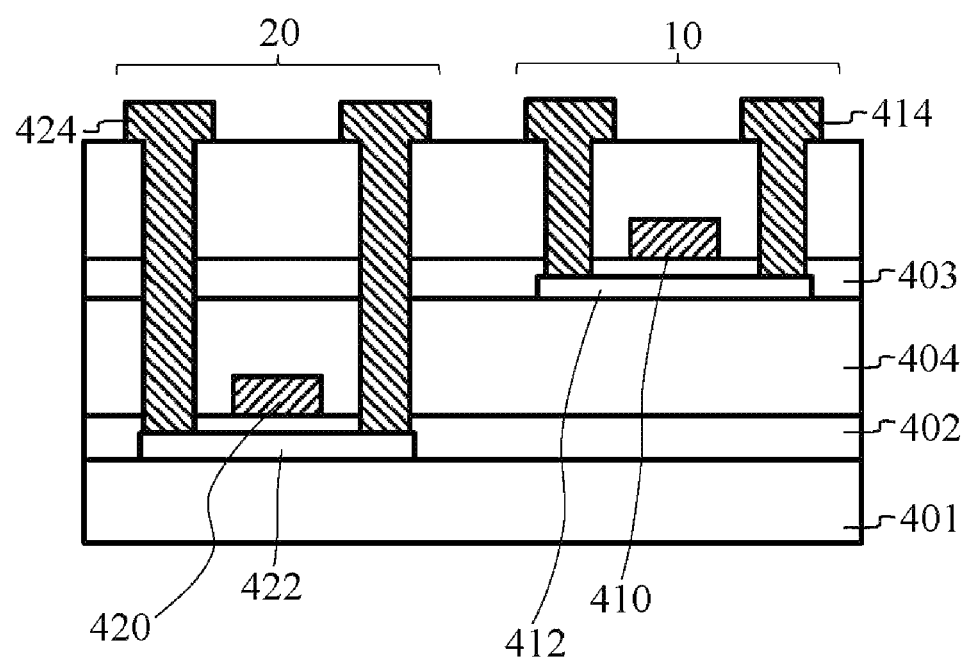
FIG. 6B shows another example cross section of the Oxide TFT 10 and the poly-Si TFT 20.

FIG. 6B shows another example cross section of the Oxide TFT 10 and the poly-Si TFT 20. Both the Oxide TFT 10 and the poly-Si TFT 20 have a top-gated structure. For simplicity in describing FIG. 6B, only structure that is different from FIG. 6A is explained.

The Oxide TFT 10 includes an oxide semiconductor layer 412, a gate 410 and a gate insulator 403. The gate insulator 403 is formed on the interlayer insulator 404. The Oxide TFT 10 has a top-gated structure, and the gate 410 is located above the oxide semiconductor layer 412 with the gate insulator 403 in between.

The poly-Si TFT 20 is disposed on a lower layer than the layer in which the Oxide TFT 10 is disposed. Because the poly-Si TFT 20 may be fabricated at a higher temperature than the Oxide TFT 10, the poly-Si TFT 20 is formed first, and then the Oxide TFT 10 is formed. The gates 410 and 420 may be formed in different processes. A gate material is not shared for the Oxide TFT 10 and the poly-Si TFT 20, and the gate insulator 402 and the gate insulator 403 are not adjacent each other. Because both the Oxide TFT 10 and the poly-Si TFT 20 have a top-gated structure, parasitic capacitance may be reduced compared to the bottom-gated Oxide TFT 10 shown in FIG. 6A.

Figure 6C:
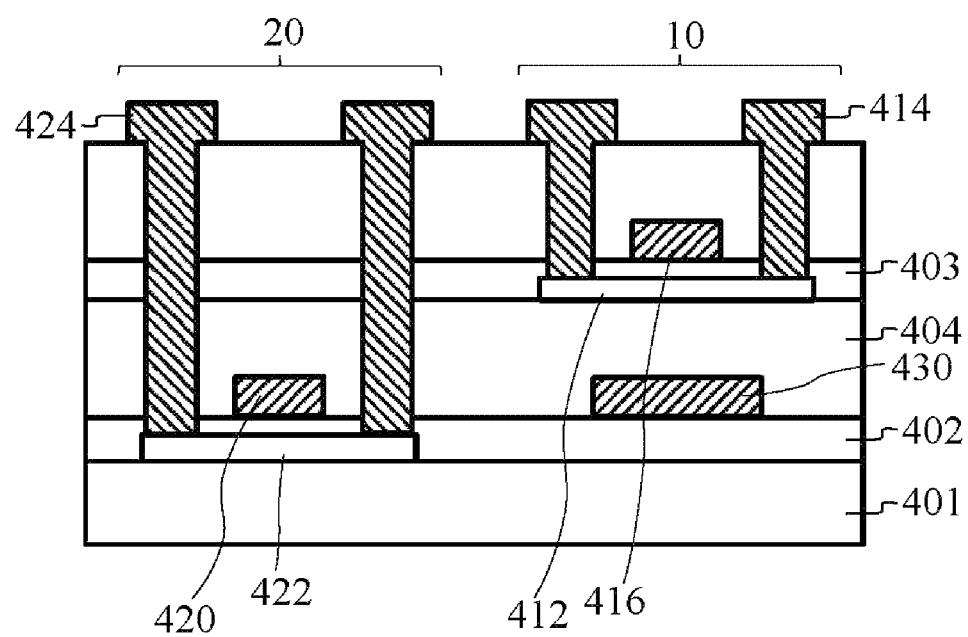
FIG. 6C shows another example cross section of the Oxide TFT 10 and the poly-Si TFT 20.

FIG. 6C shows another example cross section of the Oxide TFT 10 and the poly-Si TFT 20. A light shield layer 430 is provided under the Oxide TFT 10. For simplicity in describing FIG. 6C, only structure that is different from FIGS. 6A and 6B is explained.

The light shield layer 430 consists of the same material as a gate material of the poly-Si TFT 20. The light shield layer 430 may be formed in the same process as the gate 420. Because of the shared layer usage, the light shield layer 430 may be formed without an additional manufacturing process. The light shield layer 430 may prevent incident light from entering the Oxide TFT 10. Since the Oxide TFT 10 is sensitive to light stress, the light shield layer 430 may be effective in achieving high reliability and stability. In another example, the light shield layer 430 may work as a bottom gate of a tied dual-gated structure, such as that which is described below.

Figure 7A:
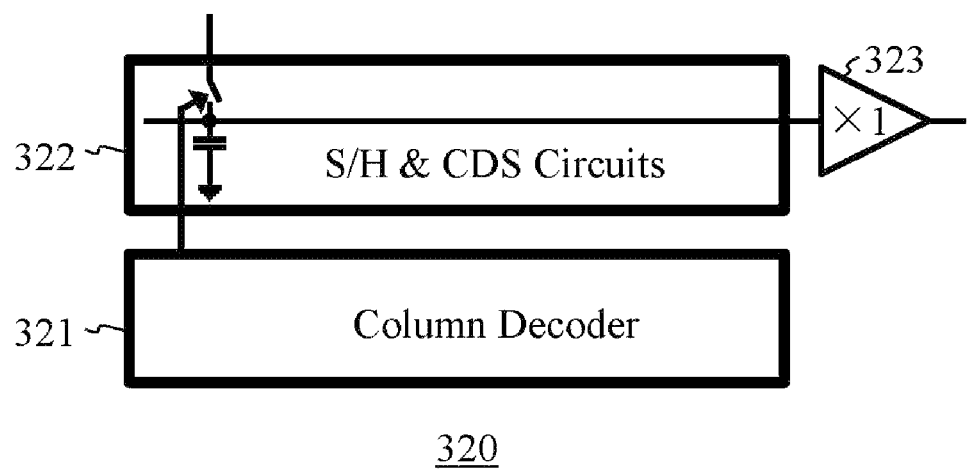
FIG. 7A shows the detailed circuit block of the column readout circuit 320.

FIG. 7A shows the detailed circuit block of the column readout circuit 320. The column readout circuit 320 includes a column decoder 321, a S/H and CDS circuit 322, and an output amplifier 323. In FIG. 7A, only one column line is shown for simplicity.

The column decoder 321 may be connected to a corresponding column line of the pixel array 310. The column decoder 321 is utilized to select the corresponding column line j. The column decoder 321 transfers the received signals to the S/H & CDS circuit 322 by switching the switch connected to the column line j.

The S/H & CDS circuit 322 samples and holds the signals received from the column line j according to the signal from column decoder 321. The S/H & CDS circuit 322 is utilized for double sampling data signals to reduce noise, such as FPN. Output signals of the S/H & CDS circuit 322 are outputted through the output amplifier 323.

Figure 7B:
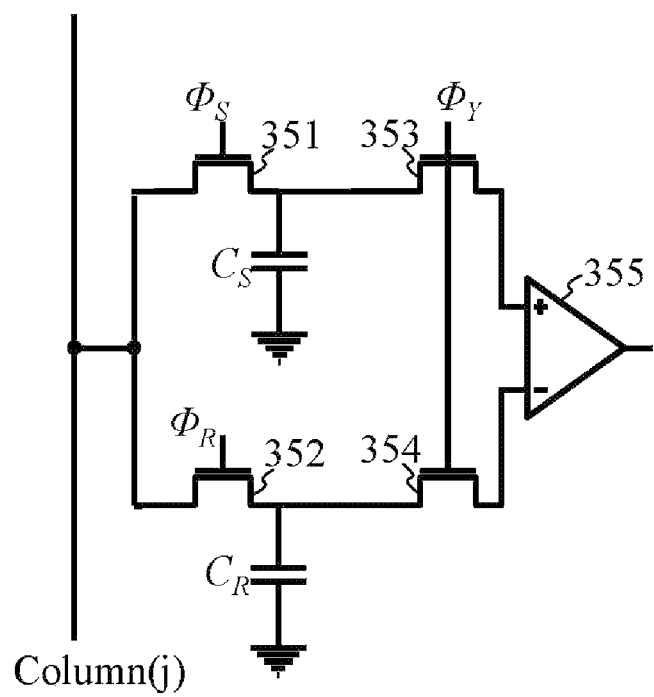
FIG. 7B shows a detailed example of the sample and hold (S/H) & corrected double sampling (CDS) circuit 322.

FIG. 7B shows a detailed example of the S/H & CDS circuit 322. The S/H & CDS circuit 322 includes a sample capacitor CS, a reset capacitor CR, four transistors 351 to 354 and a differential amplifier 355.

The transistor 351 and the transistor 352 are sample and reset switches, respectively, connected to column line j. The transistor 351 is connected to the sample capacitor CS, and the transistor 352 is connected to the reset capacitor CR. The transistor 353 and the transistor 354 are differential switches connected to the differential amplifier 355. The transistor 353 is connected to the sample capacitor CS, and the transistor 354 is connected to the reset capacitor CR. The differential amplifier 355 is a differential single ended amplifier configured to output a differential signal of the sample capacitor CS and the reset capacitor CR.

In a reset period, the transistor 352 is turned on, and the pixel output in reset condition through column line j is stored in the reset capacitor CR according to the clock of ΦR. In the signal readout period, the transistor 351 is turned on and the pixel signal output through column line j is stored in the signal capacitor CS according to the clock of ΦS. When the clock ΦY activates, the transistor 353 and the transistor 354 are turned on, and the differential amplifier 355 removes noise and outputs the result. This circuit is merely an example of a CDS circuit, and any other CDS circuit may be used.

Figure 7C:
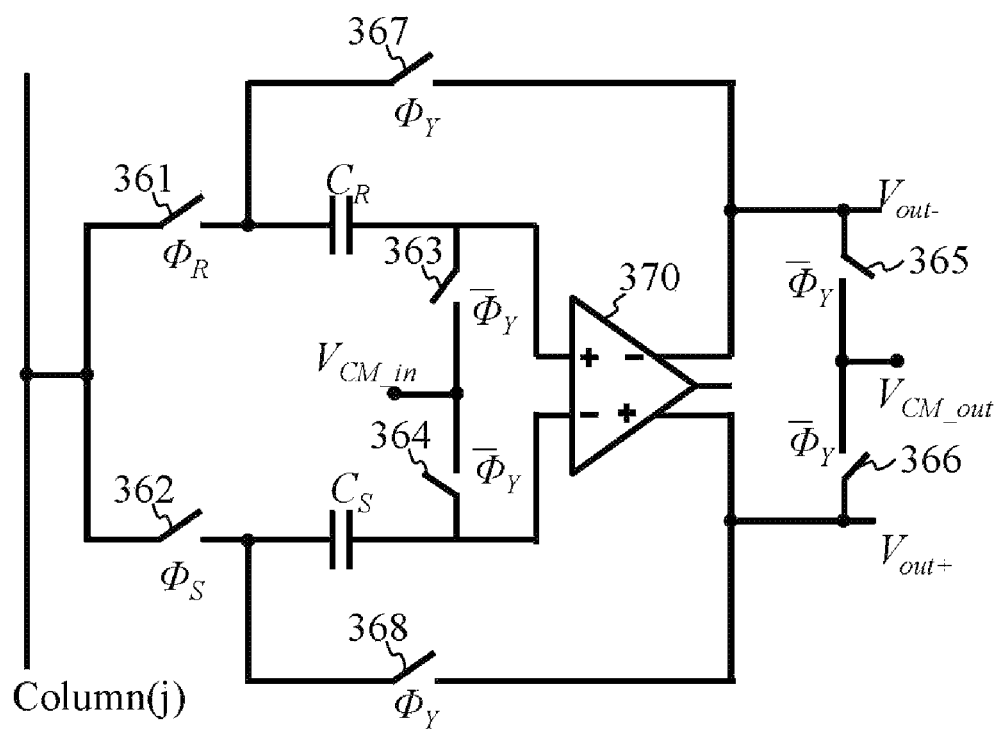
FIG. 7C shows another embodiment of the S/H & CDS circuit 322.

FIG. 7C shows another embodiment of the S/H & CDS circuit 322. The S/H & CDS circuit 322 consists of a fully differential type CDS circuit. The S/H & CDS circuit 322 includes a sample capacitor CS, a reset capacitor CR, switches 361 to 368 and a differential amplifier 370. The differential amplifier 370 is a fully differential amplifier.

The switch 361 and the switch 362 are reset and sample switches, respectively, connected to column line j. The switch 363 and the switch 364 are connected to the differential amplifier 370 and input common voltage VCM_in to the differential amplifier 370 during an inversion timing of ΦY. The switch 365 and the switch 366 are connected to the differential amplifier 370, and output common voltage VCM_out during an inversion timing of ΦY. The switch 367 and the switch 368 are connected to the differential amplifier 370 to make a feedback loop through the sample and reset capacitors CS and CR. During the ΦY phase, the S/H & CDS circuit 322 outputs differential voltage VOUT+ and VOUT−.

The S/H & CDS circuit 322 can reduce noise, such as a FPN. However, the S/H & CDS circuit 322 cannot remove the shot noise generated from a leakage current of the Oxide TFT 10. Therefore, it is preferable to reduce the leakage current by the combination of the Oxide TFT 10 and the poly-Si TFT 20.

Figure 8A:
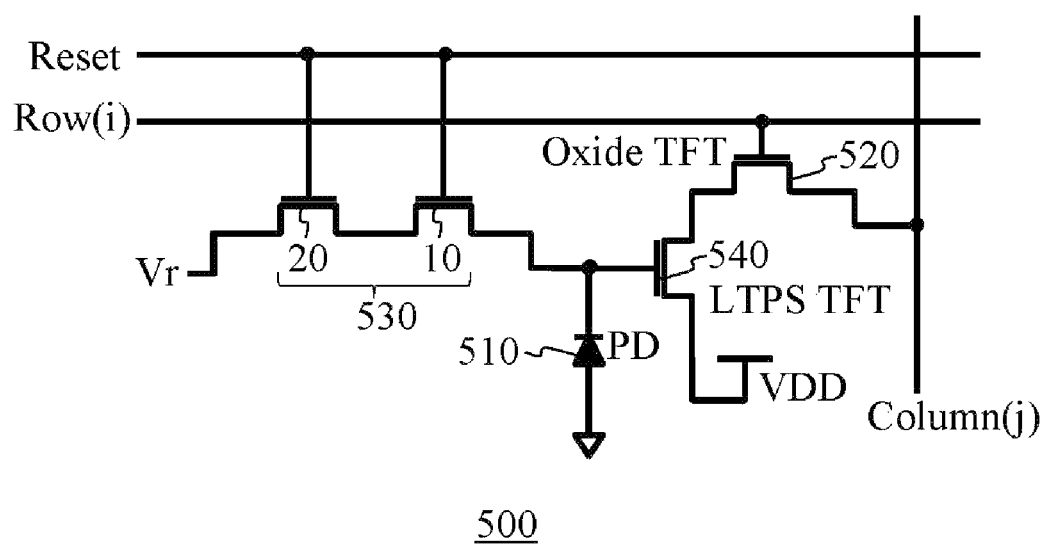
FIG. 8A shows an example of more detailed structure of APS 500.

FIG. 8A shows an example of a more detailed structure of APS 500. The APS 500 includes a photodiode 510, a readout transistor portion 520, a reset transistor portion 530 and an amplifier 540. The reset transistor portion 530 consists of the Oxide TFT 10 and the poly-Si TFT 20 in series.

The readout transistor portion 520 consists of an Oxide TFT. In an initial state, a leakage current through the Oxide TFT of the readout transistor portion 520 is low. From a practical point of view, the leakage current of the readout transistor portion 520 may not be so important because the S/H & CDS circuit 322 may reduce noise caused at the readout transistor portion 520.

The amplifier 540 consists of LTPS TFT. Because of the large mobility of an LTPS TFT, the APS 500 can realize high amplifier gain. The amplifier 540 may fabricated in the same process as the poly-Si TFT 20. Therefore, the amplifier 540 may be formed without performing additional manufacturing processes.

Figure 8B:
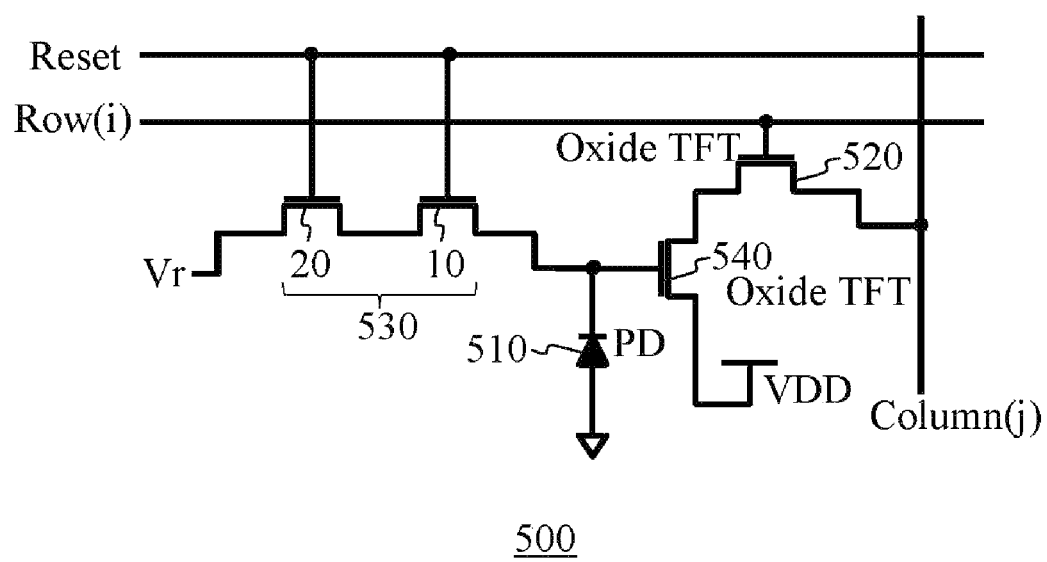
FIG. 8B shows another example of more detailed structure of APS 500.

FIG. 8B shows another example of a more detailed structure of APS 500. For simplicity in describing FIG. 8B, only structure that is different from FIG. 8A is explained.

The amplifier 540 consists of an Oxide TFT. Since the readout transistor portion 520 and the amplifier 540 have the same Oxide active channel layer, the flexibility of the layout of the circuit is increased, and the circuit may be easier to design than the layout of FIG. 8A. Because of the uniformity among the Oxide TFT structures, the sensor 300 may have more uniformity among the pixels 312.

Figure 9:
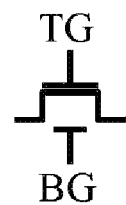
FIG. 9 shows an equivalent circuit of a dual-gated TFT.

FIG. 9 shows an equivalent circuit of a dual-gated TFT. The dual-gated TFT has both a top gate and a bottom gate. The bottom gate of the dual-gated TFT may be controlled to a predetermined voltage. As an example, the bottom gate of the dual-gated TFT may be electrically tied to the top gate of the dual-gated TFT.

The dual-gated TFT may achieve better reliability and stability with almost the same performance, while reducing power consumption. Characteristics of the dual-gated TFT will now be explained in comparison to a top-gated TFT that only has a top gate.

As for a top-gated TFT, a drain current in a linear region can be expressed as Equation 1.

$$I_{D\_t} = \frac{W}{L}\mu C_{GI\_t}(V_{G\_t} - V_{TH\_t})V_D. \quad \text{Equation 1}$$

Equation 1 represents a drain current in a linear region driven by a TFT having only a top gate. In Equation 1, ID_t is the drain current for the top-gated structure, W is a channel width, L is a channel length, μ is mobility, CGI_t is gate capacitance per unit area for the top gate, VG_t is gate voltage for the top gate, VTH_t is threshold voltage for the top gate, and VD is drain voltage.

In a saturation region, the drain current in Equation 1 will be changed into Equation 2.

$$I_{D\_t} = \frac{W}{2L}\mu C_{GI\_t}(V_{G\_t} - V_{TH\_t})^2. \quad \text{Equation 2}$$

Equation 2 represents drain current in a saturation region driven by a TFT having only a top gate.

The differences between Equation 1 and Equation 2 are the 1/2 factor and the voltage component. As for a dual-gated TFT, a drain current in a linear region is explained based on Equation 1, and that of a saturation region is easily extended to Equation 2.

If there are top and bottom gates, and those are tied together, Equation 1 is changed into Equation 3.

$$I_{D\_tb} = \frac{W}{L}\mu C_{GI\_tb}(V_{G\_tb} - V_{TH\_tb})V_D. \quad \text{Equation 3}$$

Equation 3 represents drain current in a linear region driven by a dual-gated TFT. In Equation 3, the subscript "_t" is changed into "_tb", and this represents a tied dual-gated structure.

Detailed equations for CGI_tb and VTH_tb are shown in Equations 4 and 5.

$$C_{GI\_tb} = C_{GI\_t} + C_{GI\_b}.$$

Equation 4 represents gate capacitance per unit area for a tied dual-gated structure.

$$V_{TH\_tb} = \frac{C_{GI\_b}V_{TH0\_b} + C_{GI\_t}V_{TH0\_t}}{C_{GI\_tb}}. \quad \text{Equation 5}$$

Equation 5 represents threshold voltage for a tied dual-gated structure.

In Equations 4 and 5, CGI_b is gate capacitance per unit area of a bottom gate, VTH0_b is threshold voltage for the bottom gate when a top gate is applied with 0 V, VTH0_t is threshold voltage for the top gate when a bottom gate is applied with 0 V.

In Equations 3 to 5, if the capacitances of top and bottom gates are the same (CGI_b=CGI_t), and the threshold voltages of the top and bottom gates are the same (VTH0_b=VTH0_t, the drain current ID_tb is twice of ID_t in Equation 1. This means that the drain current in a tied dual-gated structure is twice the drain current in a top gate only structure in the simplest case. In case the same drain current is required in the same system, the tied dual-gated structure can reduce gate voltage and power consumption compared to a top gate only structure.

For example, a gate voltage range in an ON state is from 5 to 15 V, if the threshold voltage is 1.5 V. Considering Equation 2 in a saturation region, if the drain current is amplified to twice, then the following equation is satisfied.

$$(V_{G\_t}-V_{TH0\_t})^2=2(V_{G\_tb}-V_{TH0\_tb})^2.$$

For simplicity, it is assumed that threshold voltage for a top gate only structure is the same as that of a tied-dual gated structure, VTH0_t=VTH0_tb. If the current is amplified to twice, the following equation is satisfied.

$$(V_{G\_t}-V_{TH0\_t})^2=2(V_{G\_tb}-V_{TH0\_t})^2$$

After solving the equation, the following equation is satisfied.

$$V_{G\_tb}=\{V_{G\_t}+(\sqrt{2}-1)*1.5\}/\sqrt{2}.$$

For example, the gate voltage of top-gate $V_{G\_t}$ is 5, 10, and 15 V. For $V_{G\_t}$=5, 10, 15 V, the gate voltage of the tied dual-gated structure $V_{G\_tb}$ becomes around 4, 7.5, 11 V, so the reduction of voltage is −1, −2.5, −4 V for each case. This effect increases as the gate voltage range increases.

Therefore, the tied dual-gated structure can reduce the amplitude of negative bias and/or positive bias. It may suppress a negative shift, and achieve lower leakage current of an Oxide TFT after stress is applied. The effect of back-gate bias to top-gate threshold voltage is explained as follows.

Figure 10:
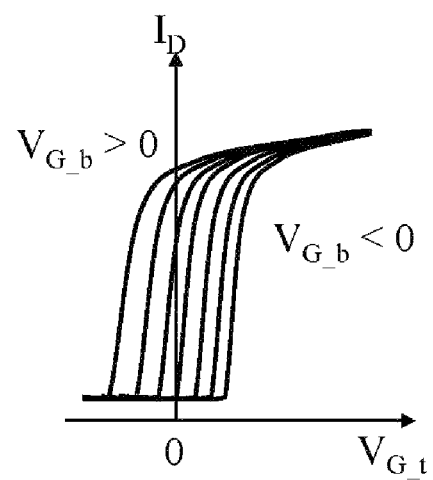
FIG. 10 shows an example of a relationship between gate voltage VG_t and drain current ID.

FIG. 10 shows an example of a relationship between gate voltage VG_t and drain current ID. A gate voltage VG_t is applied to a top gate, and drain current ID change depends on a gate voltage of the bottom gate VG_b.

If the gate voltage of the bottom gate VG_b is a positive value, then the characteristics of ID vs. VG_t shift negatively. On the other hand, if the gate voltage of the bottom gate VG_b is a negative value, then the characteristics of ID vs. VG_t shift positively. Therefore, applying more negative bias to the gate of the Oxide TFT during the OFF period can reduce the leakage current of an Oxide TFT.

Considering stress applied to the tied dual-gated structure, a bias of a top gate is the same as that of a bottom gate, and it reduces a threshold shift. For example, stress is applied to a bottom gate or both of the top and bottom gates. Stress applied to gates includes, for example, a negative gate bias stress (NBS), a negative gate illumination stress (NBIS), and a negative gate thermal stress (NBTS) to cause negative shift of threshold voltage.

Regardless of Bottom Gate NBIS or Dual Gate NBIS conditions, if the biases applied to the top and bottom gates are the same, then the threshold shift is smaller than in the condition in which the biases are applied only to the bottom gate. Bottom Gate NBIS is a condition where NBIS is applied to a bottom gate only. Dual Gate NBIS is a condition where NBIS is applied to both top and bottom gates.

As described above, a tied dual-gated structure may reduce the threshold shift compared to that of a bottom gate only structure, regardless of the sweep condition of the gate voltage. Therefore, an Oxide TFT in the embodiments herein may be changed to a tied dual-gated structure to reduce a leakage current.

Figure 11A:
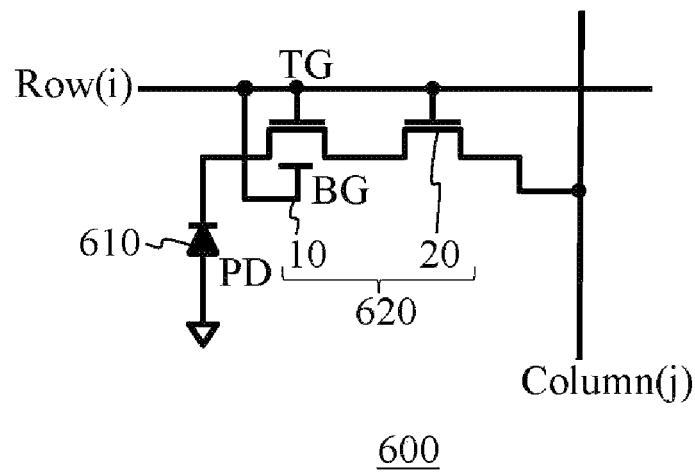
FIG. 11A shows an exemplary configuration of the pixel circuit of a PPS 600.

FIG. 11A shows an exemplary configuration of the pixel circuit of a PPS 600. The PPS 600 includes a photodiode 610 and a readout transistor portion 620. For simplicity in describing FIG. 11A, only structure that is different from FIG. 2A is explained.

The readout transistor portion 620 includes the Oxide TFT 10 and the poly-Si TFT 20. The Oxide TFT 10 consists of an Oxide TFT including a tied dual-gated structure having top and bottom gates that are connected to the same electric line among the plurality of electric lines. Therefore, the Oxide TFT 10 may achieve stability as described above. A tied dual-gated structure can reduce the characteristics shift induced by stress. The tied dual-gated structure may increase the performance of TFT, such as mobility. Therefore, an applied voltage range is reduced, and the effect of stress is suppressed.

Figure 11B:
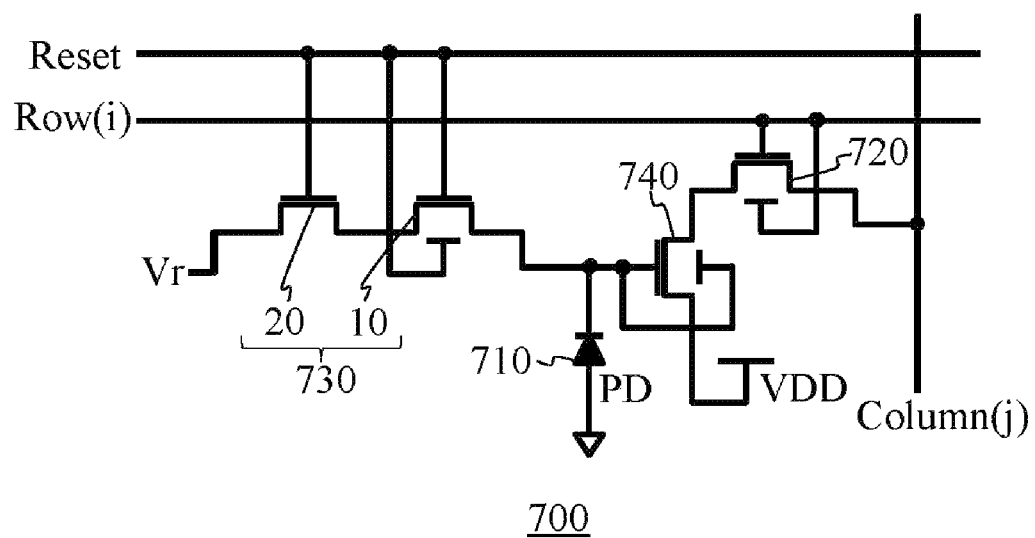
FIG. 11B shows an exemplary configuration of the pixel circuit of APS 700.

FIG. 11B shows an exemplary configuration of the pixel circuit of APS 700. The APS 700 includes a dual-gated structure. The APS 700 includes a photodiode 710, a readout transistor portion 720, a reset transistor portion 730, and an amplifier 740. For simplicity in describing FIG. 11B, only structure that is different from FIG. 2B is explained.

The readout transistor portion 720 includes an Oxide TFT having a tied dual-gated structure. The Oxide TFT of the readout transistor portion 720 includes top and bottom gates that are connected to the same electric line. The tied dual-gates of the readout transistor portion 720 are connected to a row line.

The reset transistor portion 730 includes the Oxide TFT 10 and the poly-Si TFT 20. The Oxide TFT 10 has tied dual-gates that are connected to the same electric line. The dual-gates of the Oxide TFT 10 are connected to the reset line.

The amplifier 740 includes an Oxide TFT having a tied dual-gated structure. The top and bottom gates of the amplifier 740 are connected to the cathode of the photodiode 710.

In the APS 700, all of the Oxide TFTs are changed to include a tied dual-gated structure. This structure reduces the negative shift of threshold voltage of the Oxide TFTs.

Figure 11C:
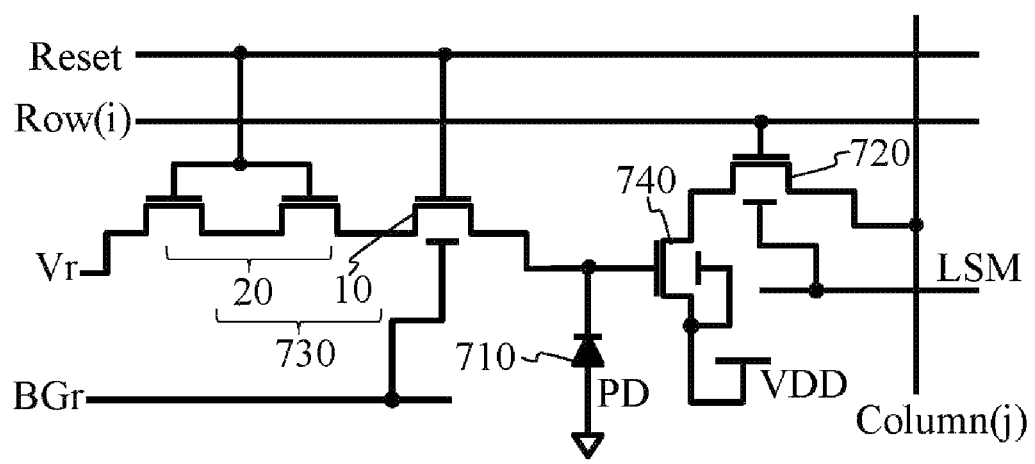
FIG. 11C shows another exemplary configuration of the pixel circuit of APS 700.

FIG. 11C shows another exemplary configuration of the pixel circuit of APS 700. The APS 700 includes dual-gated structure, but the bottom gate is not electrically tied to the top gate. For simplicity in describing FIG. 11C, only structure that is different from FIG. 11B is explained.

The Oxide TFT 10 includes the dual-gated TFT structure with the bottom gate that is not electrically tied to the top gate. The top gate of the Oxide TFT 10 may be connected to a reset line. The bottom gate of the Oxide TFT 10 may be connected to a Bottom Gate reset line (BGr line). A reset line is an example of a first line. A BGr line is an example of a second line that is different from the first line.

The poly-Si TFT 20 includes a twin-gated structure. The twin-gate is connected to a reset line. The twin-gated TFT of the poly-Si TFT 20 is connected to the Oxide TFT 10 in series.

The readout transistor portion 720 includes the dual-gated TFT structure with the bottom gate that is not electrically tied to the top gate. The top gate of the readout transistor portion 720 may be connected to a row line i. The bottom gate of the readout transistor portion 720 may be connected to a line synchronization module (LSM) line. For example, the bottom gate of the readout transistor portion 720 may be connected to a light shield layer, such as the light shield layer 430 disclosed in FIG. 6C.

The amplifier 740 includes an Oxide TFT having a dual-gated structure. The bottom gate of the amplifier 740 is not electrically tied to the top gate. The bottom gate of the amplifier 740 is connected to a VDD line.

The bottom gate of the Oxide TFT is also controlled, in addition to the top gate of the Oxide TFT. By controlling the bottom gate of the Oxide TFT, the threshold voltage of Oxide TFT shifts positively. It can change the negative shift of the threshold voltage induced by stress toward the normal operating point.

Figure 11D:
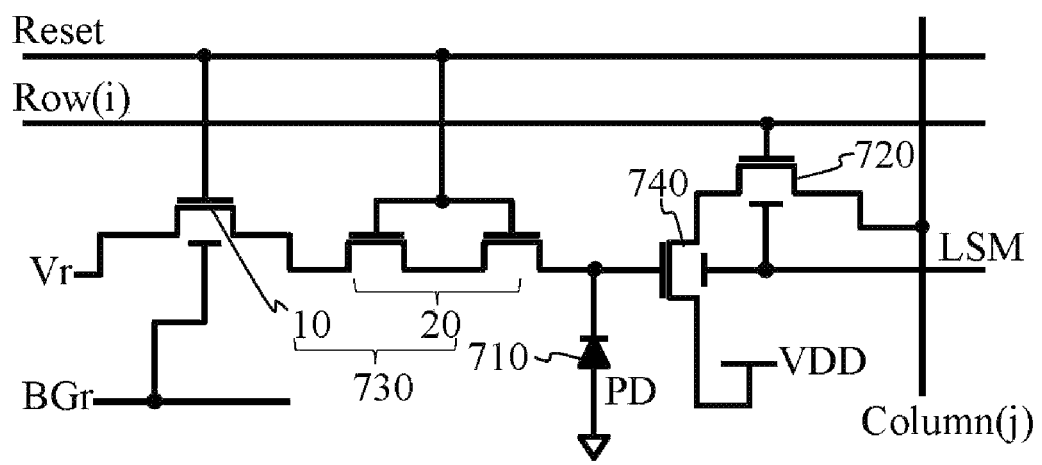
FIG. 11D shows another exemplary configuration of the pixel circuit of APS 700.

FIG. 11D shows another exemplary configuration of the pixel circuit of APS 700. The APS 700 includes dual-gated structure, but the bottom gate is not electrically tied to the top gate. For simplicity in describing FIG. 11D, only structure that is different from FIG. 11C is explained.

The readout transistor portion 720 includes the dual-gated TFT structure with the bottom gate that is not electrically tied to the top gate. The bottom gate of the readout transistor portion 720 may be connected to an LSM line.

The amplifier 740 includes an Oxide TFT having a dual-gated structure. The bottom gate of the amplifier 740 is connected to the LSM line. Therefore, the bottom gates of the readout transistor portion 720 and the amplifier 740 are connected together and connected to the LSM line.

The order of the Oxide TFT 10 and the poly-Si TFT 20 in FIG. 11D is different from that of FIG. 11C. The placement of the Oxide TFT 10 and the poly-Si TFT 20 is switched. In FIG. 11D, The poly-Si TFT 20 is connected to the cathode of the photodiode 710.

As recited in FIG. 11C and FIG. 11D, voltages applied to the bottom gates of the Oxide TFTs may be flexibly changed to BGr or LSM line. As a result of this flexibility, the APS 700 can change the gate voltages of the bottom gates to make the characteristics of the Oxide TFTs more stable and reliable.

Figure 12:
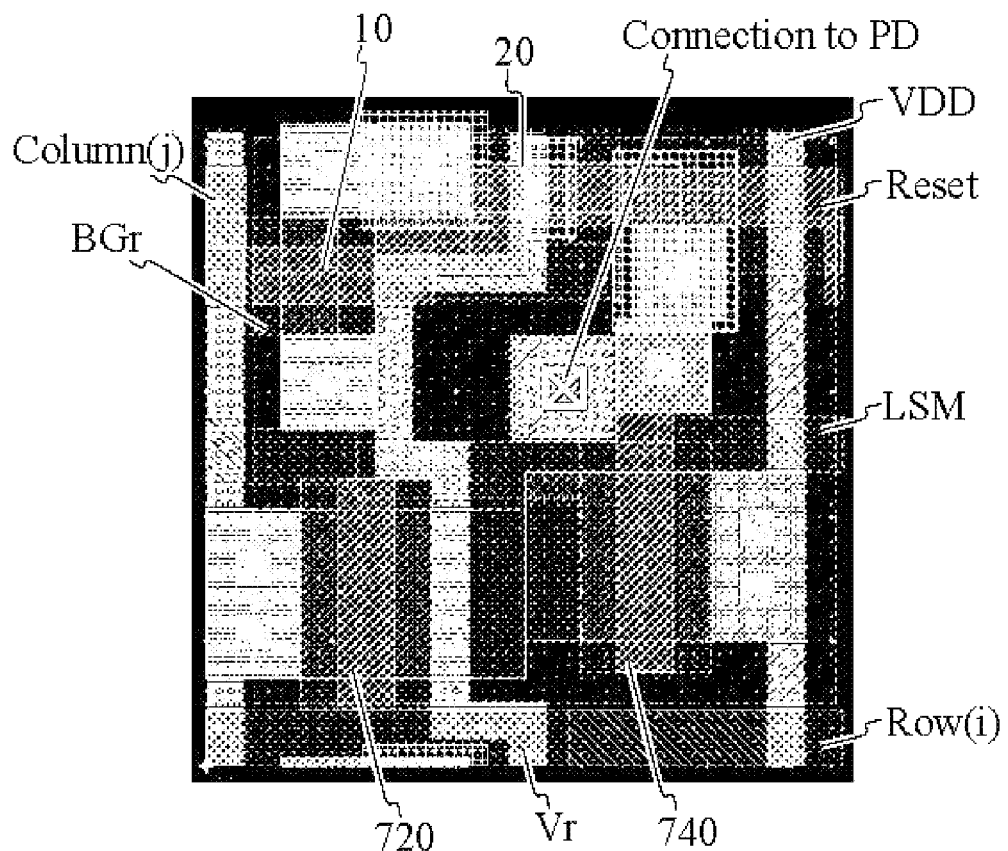
FIG. 12 shows an example of layout of the APS 700 shown in FIG. 11D.

FIG. 12 shows an example of layout of the APS 700 shown in FIG. 11D. The layout of the APS 700 is merely an example of the mask layout, and it is not limited to this embodiment. As an example, the pixel pitch may be 50.8 micrometers (μm). The channel size of the Oxide TFT of the amplifier 740 may be 18.5 μm in width and 4.5 μm in length. For example, amplifier gain of the amplifier 740 may be over 150 with mobility of 10 centimeters $(cm)^2$/V·seconds (s) of the Oxide channel.

Figure 13:
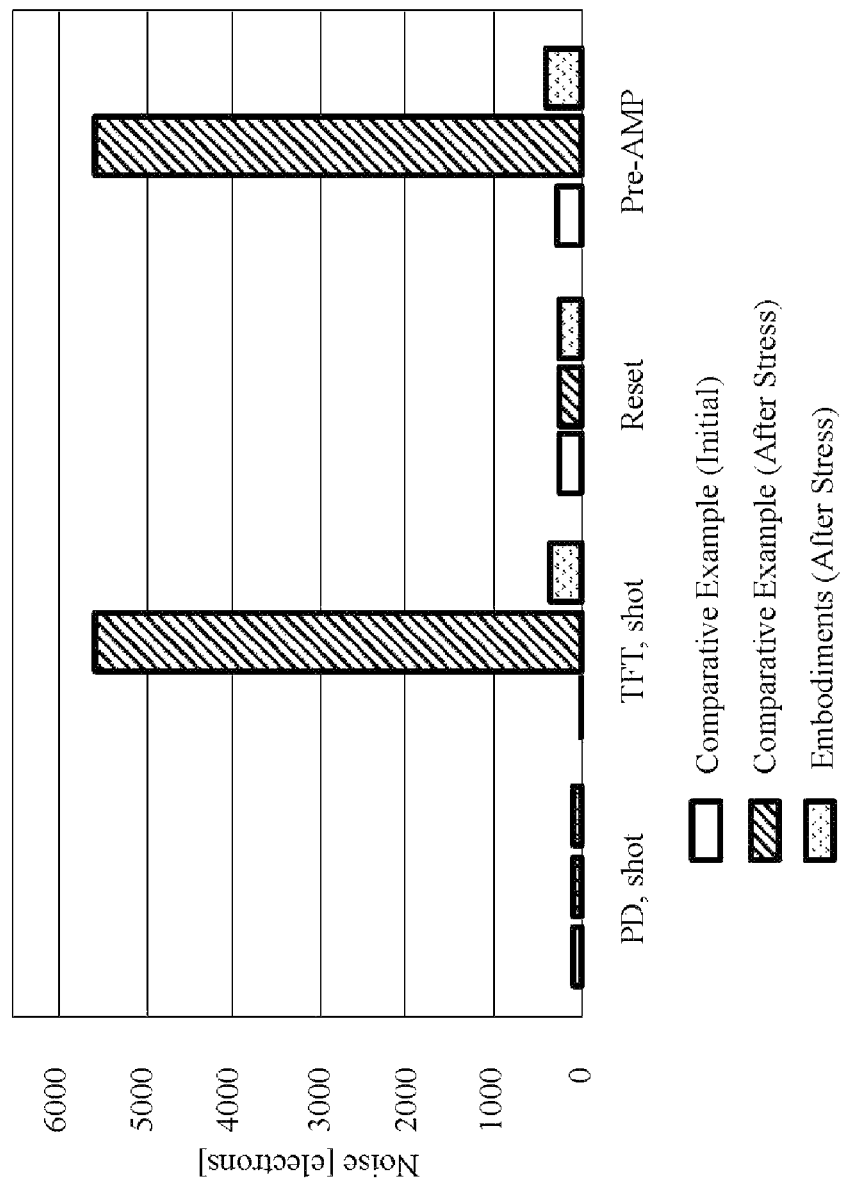
FIG. 13 shows noise characteristics of the embodiments and a comparative example.

FIG. 13 shows noise characteristics of the embodiments and a comparative example. "Comparative Example (Initial)" represents noise of the comparative structure before a characteristics shift. "Comparative Example (After Stress)" represents noise of the comparative structure after a characteristics shift. "Embodiments (After Stress)" represents noise of the embodiments herein after a characteristics shift. For purposes of this chart, the stress was caused by a temperature increase of 50 degrees centigrade.

In this graph, each part of the circuit "PD, shot", "TFT, shot" and "reset", as well as total noise "pre-AMP" are shown. "PD, shot" is shot noise of a photodiode in a pixel, "TFT, shot" is shot noise of TFTs, and "reset" is the noise at resetting. "Pre-AMP" is the noise occurring in a circuit before an output amplifier. These noises occur before signals are outputted to an external circuit.

The total noise of "Comparative Example (Initial)" is around 234 electrons. The total noise of "Comparative Example (After Stress)" is over 5500 electrons before an external circuit. The total noise of "Embodiments (After Stress)" is around 380 electrons, even after the temperature goes up to 50 degrees centigrade. As a result, the noise of the comparative example after stress goes up 2300% higher compared to the initial state. On the other hand, the noise of the embodiments herein only increases around 60%.

Figure 14A:
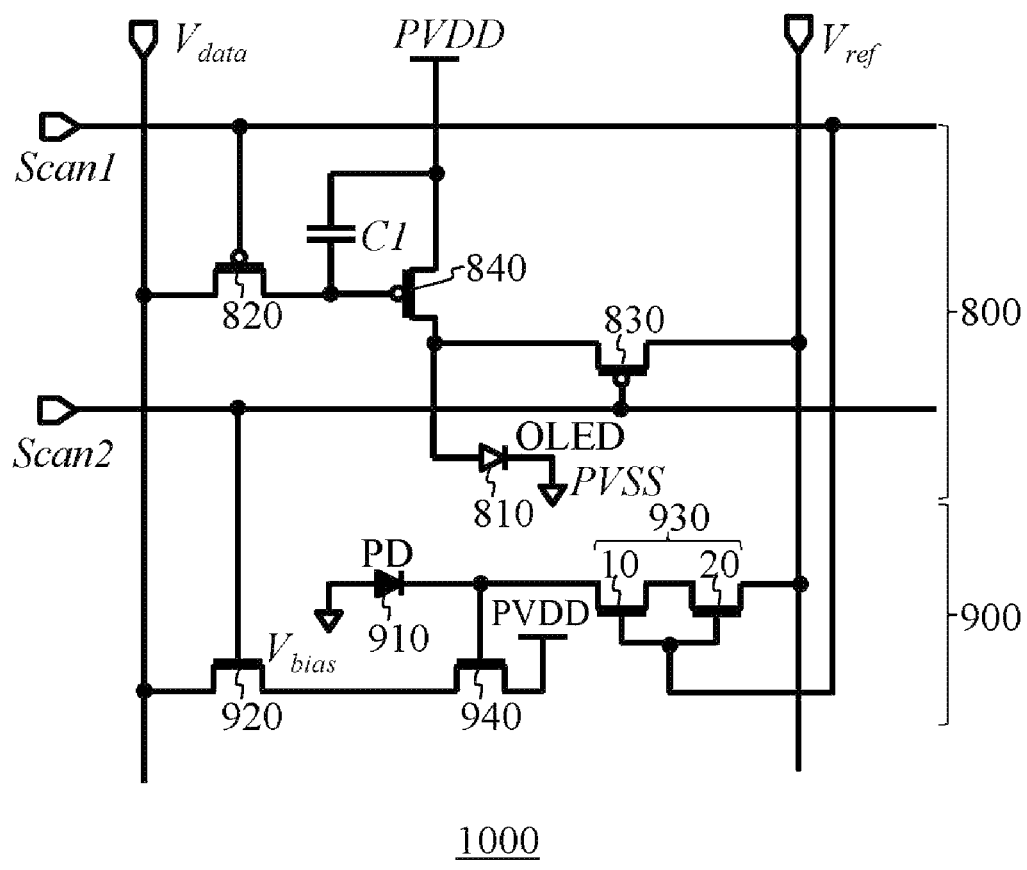
FIG. 14A is an example of display device 1000 having in-cell APS for organic light-emitting diode (OLED) display.

FIG. 14A is an example of display device 1000 having in-cell APS for OLED display. The display device 1000 includes the APS circuit with other circuits in the same cell, especially circuits for display and optoelectronic material. The display device 1000 includes a light emitting portion 800 and a photodiode portion 900. In this embodiment, the display device 1000 is an OLED display, but it may be applicable to light-emitting diode (LED) or other displays.

The light emitting portion 800 includes a light emitting diode 810, a switching transistor 820, a reset transistor portion 830, a drive transistor portion 840 and a holding capacitor C1. The light emitting diode 810 is connected to the reset transistor portion 830 and the drive transistor portion 840. For example, the light emitting diode 810 and the drive transistor portion 840 are connected in series between lines of PVDD and PVSS. The switching transistor 820 is connected to a gate of the drive TFT portion 840. The holding capacitor C1 is placed between drain and gate of the drive TFT portion 840. The reset transistor portion 830 is an example of a first reset transistor.

The photodiode portion 900 includes a photodiode 910, a readout transistor portion 920, a reset transistor portion 930, an amplifier 940. The photodiode portion 900 may include the Oxide TFT 10 and poly-Si TFT 20 in series that is disclosed in other embodiments. The reset transistor portion 930 is an example of a second reset transistor.

The light emitting portion 800 and the photodiode portion 900 operate alternatively. For example, during a light emitting period of the light emitting portion 800, the photodiode portion 900 resets data. On the other hand, during a readout period of the photodiode portion 900, the light emitting portion 800 resets data. For instance, during a light emitting period of the light emitting diode 810, the reset transistor portion 930 resets data. During a readout period of the readout transistor portion 920, the reset transistor portion 830 resets data.

Referring to FIG. 14A, a gate of the switching transistor 820 and a gate of the reset transistor portion 930 are connected to a first scan line. A gate of the reset transistor portion 830 of the light emitting portion 800 and the readout transistor portion 920 are connected to a second scan line.

The switching transistor 820 and the readout transistor portion 920 may be connected to the same data voltage line. In this embodiment, the switching transistor 820 and the readout transistor portion 920 are connected to the same Vdata line.

The reset transistor portion 830 and the reset transistor portion 930 may be connected to the same reference voltage line. In this embodiment, the switching transistor 820 and the readout transistor portion 920 are connected to the same reference voltage Vref line.

The light emitting portion 800 may be configured by a p-channel metal-oxide-semiconductor field-effect transistor (MOSFET) ((PMOS)) poly-Si TFT. In this embodiment, the switching transistor 820, the reset transistor portion 830, and the drive transistor portion 840 consist of PMOS poly-Si TFTs such as LTPS.

The photodiode portion 900 may be configured by mainly Oxide TFTs. In this embodiment, the Oxide TFT 10, the readout transistor portion 920, and the amplifier 940 consist of Oxide TFTs. The poly-Si TFT 20 consists of n-channel MOSFET (NMOS) poly-Si TFT such as LTPS.

Thus, the display device 1000 alternatively operates the light emitting portion 800 and photodiode portion 900 using the common scan line and voltage line. Therefore, the display device 1000 can reduce the number of electric lines connecting the light emitting portion 800 and the photodiode portion 900.

In this example, the scan signal of Scan1 switch on the switching transistor 820 and write data voltage Vdata to holding capacitor C1. In parallel, the Scan1 resets the photodiode portion 900 through the reset transistor portion 930.

The scan signal of Scan2 resets the light emitting portion 800 through reset transistor portion 830. In parallel, the readout transistor portion 920 of the photodiode portion 900 is switched on and the signal at the photodiode 910 is readout through the Vdata line.

Figure 14B:
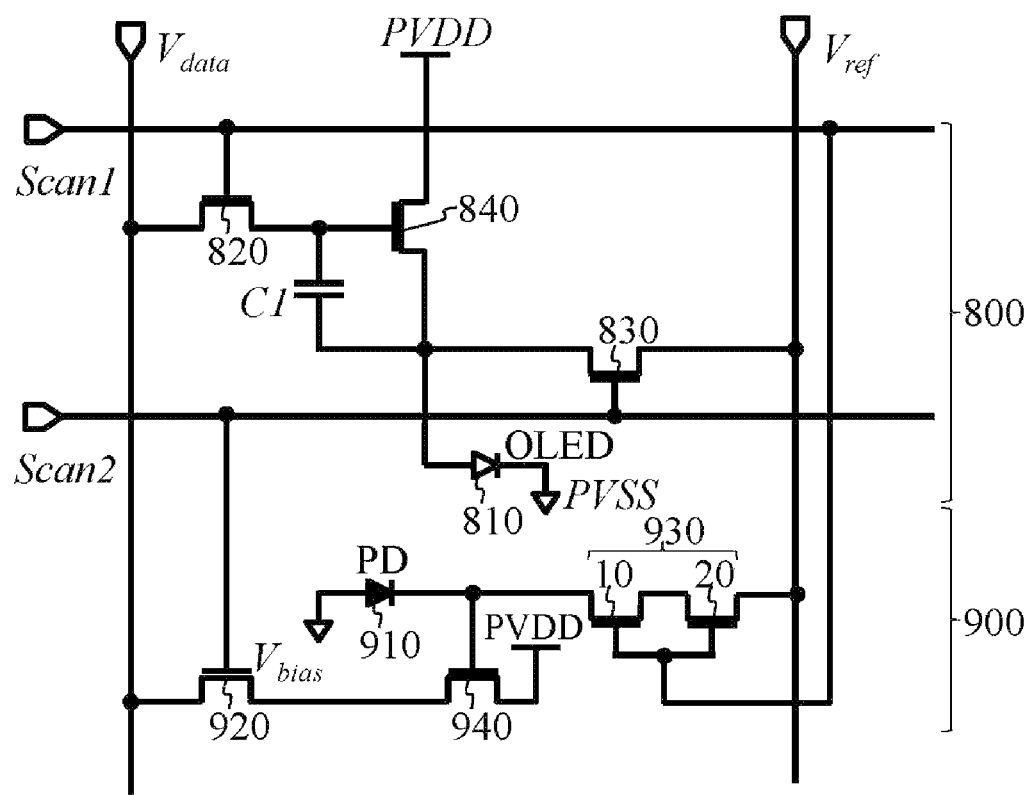
FIG. 14B is another example of display device 1000 having in-cell APS for OLED display.

FIG. 14B is another example of display device 1000 having in-cell APS for OLED display. In this example, all TFTs are made by NMOS TFTs. Most of TFTs are made by Oxide TFTs and one TFT is made by poly-Si TFT. For simplicity in describing FIG. 14B, only structure that is different from FIG. 14A is explained.

The switching transistor 820, the reset transistor portion 830, and the drive transistor portion 840 consist of Oxide TFTs. The holding capacitor C1 is placed between a drain and a gate of the drive transistor portion 840. The Oxide TFT 10, the readout transistor portion 920 and the amplifier 940 consist of Oxide TFTs. The poly-Si TFT 20 is made by poly-Si TFT such as LTPS. The basic operation is the same as FIG. 14A.

A display device 1000 may include the sensor 300 including the Oxide TFT 10 and the poly-Si TFT 20 in series. The display device 1000 may be used under stress conditions such as high temperature and strong light flux, such as in direct sunlight, which will accelerate the characteristic shift.

In the description, the characteristic shift is denoted as being caused by negative bias. In other cases, Electrostatic discharge (ESD) damage can cause almost the same shift. Therefore, the Oxide TFT 10 and the poly-Si TFT 20 may be used under ESD conditions.

The Oxide TFT shows a negative shift of ID-Vg characteristics, which increases the leakage. The combination of the Oxide TFT and the poly-Si TFT 20 is used to suppress the leakage current increase of the Oxide TFT 10.

This technology is applicable not only to optical sensors, but also other sensors' pixel circuitry having similar readout and reset systems. For example, this technology may be used for capacitive sensors, mechanical sensors, magnetic sensors, and chemical sensors.

While the embodiments of the present disclosure have been described, the technical scope of the disclosure is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the disclosure.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A sensor comprising:
    a plurality of electric lines comprising row lines and column lines;
    a photodiode corresponding to a pixel of a pixel array;
    a first transistor comprising a first gate, a first source, and a first drain, wherein the first drain is coupled to the photodiode, and wherein the first transistor is an oxide thin-film transistor (TFT); and
    a second transistor comprising a second gate, a second source, and a second drain,
    wherein the second transistor is a poly-silicon (Si) TFT,
    wherein the poly-Si TFT comprises a twin-gated structure,
    wherein the twin-gated structure comprises a split gate,
    wherein the second drain is coupled in series with the first source,
    wherein the second source is coupled to a first column line among the column lines,
    wherein the first gate and the second gate are coupled to a same electric line among the electric lines, and
    wherein a first channel material of the first transistor is different from a second channel material of the second transistor.

2. The sensor of claim 1, wherein the first channel material is an oxide and the second channel material is a non-oxide.

3. The sensor of claim 1, wherein the photodiode comprises a cathode, and wherein the oxide TFT is arranged between the cathode and the poly-Si TFT.

4. The sensor of claim 1, wherein the oxide TFT comprises a tied dual-gated structure comprising top gates and bottom gates, and wherein the top gates and the bottom gates are coupled to a same electric line among the electric lines.

5. The sensor of claim 1, wherein the oxide TFT comprises a dual-gated structure comprising:
    a top gate coupled to a first line among the electric lines; and
    a bottom gate coupled to a second line among the electric lines, and wherein the first line and the second line are different.

6. The sensor of claim 1, wherein the first transistor is a bottom gate transistor and the second transistor is a top gate transistor.

7. The sensor of claim 1, wherein the first transistor and the second transistor are top gate transistors, and wherein the second transistor is disposed in a first layer that is lower than a second layer in which the first transistor is disposed.

8. The sensor of claim 7, further comprising a light shield layer located under the first transistor, wherein the light shield layer comprises a same material as a gate material of the second gate.

9. A sensor comprising:
    a plurality of electric lines comprising row lines, column lines, and reset lines;
    a photodiode corresponding to a pixel of a pixel array;
    a readout transistor portion between the photodiode and a column line among the electric lines, wherein the readout transistor portion comprises a gate coupled to a first row line among the row lines;

a first transistor comprising a first gate, a first source, and a first drain, wherein the first drain is coupled to the photodiode; and a second transistor comprising a second gate, a second source, and a second drain, wherein the second drain is coupled in series with the first source, wherein the first gate and the second gate are coupled to a first reset line of the reset lines, and wherein a first channel material of the first transistor is different from a second channel material of the second transistor.

10. The sensor of claim 9, wherein the first channel material is an oxide and the second channel material is a non-oxide.

11. The sensor of claim 10, wherein the first transistor is an Oxide thin-film transistor (TFT) and the second transistor is a poly-silicon (Si) TFT.

12. The sensor of claim 11, wherein the photodiode comprises a cathode, wherein the Oxide TFT is arranged between the cathode and the poly-Si TFT.

13. The sensor of claim 11, wherein the poly-Si TFT comprises a twin-gated structure, and wherein the twin-gated structure comprises a split gate.

14. A display device comprising:
a sensor comprising:
a plurality of electric lines comprising row lines and column lines;
a photodiode corresponding to a pixel of a pixel array;
a first transistor comprising a first gate, a first source, and a first drain, wherein the first drain is coupled to the photodiode, and wherein the first transistor is an oxide thin-film transistor (TFT); and
a second transistor comprising a second gate, a second source, and a second drain,
wherein the second transistor is a poly-silicon (Si) TFT,
wherein the poly-Si TFT comprises a twin-gated structure,
wherein the twin-gated structure comprises a split gate,
wherein the second drain is coupled in series with the first source,
wherein the second source is coupled to a first column line among the column lines,
wherein the first gate and the second gate are coupled to a same electric line among the electric lines,
wherein a first channel material of the first transistor is an oxide, and
wherein a second channel material of the second transistor is a non-oxide.

15. The display device of claim 14, wherein the photodiode comprises a cathode, and wherein the oxide TFT is arranged between the cathode and the poly-Si TFT.

16. The display device of claim 14, wherein the oxide TFT comprises a tied dual-gated structure comprising top gates and bottom gates, and wherein the top gates and the bottom gates are coupled to a same electric line among the electric lines.

17. A display device comprising:
a sensor comprising:
a plurality of electric lines comprising row lines, column lines, and reset lines;
a photodiode corresponding to a pixel of a pixel array;
a readout transistor portion between the photodiode and a first column line among the column lines, wherein the readout transistor portion comprises a gate coupled to a first row line among the row lines;
a first transistor comprising a first gate, a first source, and a first drain, wherein the first drain is coupled to the photodiode; and
a second transistor comprising a second gate, a second source, and a second drain,
wherein the second drain is coupled in series with the first source,
wherein the first gate and the second gate are coupled to a first reset line of the reset lines, and
wherein a first channel material of the first transistor is different from a second channel material of the second transistor.

18. The display device of claim 17, wherein the first channel material is an oxide and the second channel material is a non-oxide.

19. A display device, comprising:
a light emitting portion comprising a light emitting diode, a switching transistor comprising a first gate, and a first reset transistor; and
a photodiode portion comprising a readout transistor and a second reset transistor comprising a second gate,
wherein the second reset transistor is configured to reset data during a light emitting period of the light emitting diode, and wherein the first reset transistor is configured to reset data during a readout period of the readout transistor,
wherein the first gate and the second gate are configured to be coupled to a first scan line, and
wherein the first gate and the readout transistor are configured to be coupled to a second scan line.

20. The display device of claim 19, wherein the switching transistor and the readout transistor are configured to be coupled to a same data voltage line, and wherein the first reset transistor and the second reset transistor are coupled to a same reference voltage line.

* * * * *